*(12)* United States Patent
Tokunaga et al.

(10) Patent No.: US 7,782,112 B2
(45) Date of Patent: Aug. 24, 2010

(54) DEVICE AND METHOD FOR GENERATING CLOCK SIGNAL

(75) Inventors: Yusuke Tokunaga, Hyogo (JP); Shiro Sakiyama, Kyoto (JP); Shiro Dosho, Osaka (JP); Akinori Matsumoto, Osaka (JP)

(73) Assignee: Panasonic Corporation, Osaka (JP)

( * ) Notice: Subject to any disclaimer, the term of this patent is extended or adjusted under 35 U.S.C. 154(b) by 108 days.

(21) Appl. No.: 12/330,947

(22) Filed: Dec. 9, 2008

(65) Prior Publication Data

US 2009/0167400 A1 Jul. 2, 2009

(30) Foreign Application Priority Data

Dec. 26, 2007 (JP) ............... 2007-334980

(51) Int. Cl.
*G06F 1/04* (2006.01)
(52) U.S. Cl. ..................... 327/291; 327/298
(58) Field of Classification Search ........... None
See application file for complete search history.

(56) References Cited

U.S. PATENT DOCUMENTS

| 5,847,588 | A | 12/1998 | McDermott |
| 6,052,004 | A | 4/2000 | Saeki |
| 6,150,847 | A * | 11/2000 | Lu ................. 326/93 |
| 6,803,796 | B2 * | 10/2004 | Huang et al. ........... 327/99 |
| 6,809,567 | B1 | 10/2004 | Kim et al. |
| 6,844,765 | B2 | 1/2005 | Sasaki |
| 7,353,419 | B1 * | 4/2008 | Liu ................. 713/503 |
| 2004/0017243 | A1 | 1/2004 | Sasaki |
| 2007/0127614 | A1 * | 6/2007 | Kawakami ............. 375/373 |

FOREIGN PATENT DOCUMENTS

| JP | 11-004145 | 1/1999 |
| JP | 2001-318731 | 11/2001 |
| JP | 2004-054632 | 2/2004 |

* cited by examiner

*Primary Examiner*—Cassandra Cox
(74) *Attorney, Agent, or Firm*—McDermott Will & Emery LLP

(57) ABSTRACT

In a device for generating a clock signal having a desired phase from input multi-phase clock signals, an intermediate clock generator generates, by using one of the input multi-phase clock signals as a reference clock signal, multi-phase intermediate clock signals in which one cycle is equal to a plurality of cycles of the reference clock signal. A first phase selector selects one of the multi-phase intermediate clock signals. A second phase selector selects one of the multi-phase clock signals. A latch circuit latches the intermediate clock signal selected by the first phase selector with the clock signal selected by the second phase selector.

12 Claims, 9 Drawing Sheets

DEVICE AND METHOD FOR GENERATING CLOCK SIGNAL

CROSS REFERENCE TO RELATED APPLICATION

The disclosure of Japanese Patent Application No. 2007-334980 filed on Dec. 26, 2007 including specification, drawings and claims is incorporated herein by reference in its entirety.

BACKGROUND OF THE INVENTION

1. Field of the Invention

The present invention relates to a device and a method for generating a clock signal, and particularly relates to a device and a method for generating a clock signal having a desired phase from input multi-phase clock signals.

2. Description of the Related Art

Generally, in electronic equipment, various kinds of circuit elements are driven in accordance with clock signals having various phases. In order to generate clock signals having various phases, a conventional clock generation device generates all pieces of candidate phase information by combining a plurality of phase interpolation circuits and selects one piece from the generated information pieces (see Japanese Laid-Open Publication No. 11-4145, for example). Another conventional clock generation device generates all pieces of candidate phase information by dividing the frequency of a high-speed master clock signal and selects one piece from the generated information pieces (see the specification of U.S. Pat. No. 5,847,588, for example).

SUMMARY OF THE INVENTION

The conventional clock generation devices need a circuit for generating all pieces of phase information and a phase selector for selecting one piece from all of the generated pieces of phase information. The conventional clock generation devices are thus inevitably increased in circuit size. In particular, in a CCD imaging system, etc., since clock signals having a plurality of (e.g., around 15) phases are used, a plurality of phase selectors are needed, resulting in a further increase in the circuit size of the clock generation device. Also, in recent large-scale SoCs (System on Chips), clock-signal skew adjustment is necessary in various parts, and if conventional clock generation devices are incorporated in those various parts for such skew adjustment, the circuit size of the entire chip will be increased exponentially, leading to an increase in fabrication cost.

Furthermore, in the case of phase selectors to which more than several tens of phases are input, it is difficult to maintain symmetry of signal path delay. For example, when phase selectors are formed on a semiconductor wafer, it is difficult to ensure symmetry even if the circuit configuration is symmetric because of impurity concentration gradients, variations, etc. occurring during fabrication. Although it is possible to improve the circuit symmetry on the wafer by using a common centroid method or the like, a redundant circuit will be needed, and thus the circuit size will again be increased.

In view of the above, it is therefore an object of the present invention to generate a clock signal having a desired phase from input multi-phase clock signals using a circuit of relatively small size.

In order to achieve the object, an inventive clock signal generation device includes: an intermediate clock generator for generating, by using one of input multi-phase clock signals as a reference clock signal, multi-phase intermediate clock signals each of whose one cycle is equal to a plurality of cycles of the reference clock signal and among which a minimum phase difference is greater than a minimum phase difference among the multi-phase clock signals; a first phase selector for selecting one of the multi-phase intermediate clock signals; a second phase selector for selecting one of the multi-phase clock signals; and a latch circuit for latching the intermediate clock signal selected by the first phase selector with the clock signal selected by the second phase selector. Also, an inventive method for generating a clock signal includes: a first step of generating, by using one of input multi-phase clock signals as a reference clock signal, multi-phase intermediate clock signals each of whose one cycle is equal to a plurality of cycles of the reference clock signal and among which a minimum phase difference is greater than a minimum phase difference among the multi-phase clock signals; a second step of selecting one of the multi-phase intermediate clock signals; a third step of selecting one of the multi-phase clock signals; and a fourth step of latching the intermediate clock signal selected in the second step with the clock signal selected in the third step.

According to the invention, only a relatively small number of multi-phase intermediate clock signals need to be generated to obtain a clock signal having a desired phase, and the total number of inputs to the first and second phase selectors becomes less. It is thus possible to generate high resolutional phase information using the circuit of relatively small size.

Specifically, the intermediate clock generator generates, as the multi-phase intermediate clock signals, multi-phase clock signals whose specific logic level periods do not overlap each other. More specifically, the intermediate clock generator includes: a counter for performing a counting operation in synchronization with the reference clock signal; and a shift register for shifting an output of the counter in synchronization with the reference clock signal. Alternatively, the intermediate clock generator includes: a frequency divider for dividing a frequency of the reference clock signal; a shift register for shifting an output of the frequency divider in synchronization with the reference clock signal; and a logic operation section for performing an AND operation on each possible pair of signals which are adjacent in terms of phase relation each other among an output of the frequency divider and outputs of registers included in the shift register.

Also, specifically, the intermediate clock generator generates, as the multi-phase intermediate clock signals, multi-phase clock signals whose specific logic level periods overlap each other; and the second phase selector selects the clock signal so that the intermediate clock signal selected by the first phase selector is latched by the latch circuit while being stable at the specific logic level. More specifically, the intermediate clock generator includes: a counter for performing a counting operation in synchronization with the reference clock signal; and a shift register for shifting an output of the counter alternately in synchronization with the reference clock signal and a second reference clock signal, which is one of the multi-phase clock signals and different from the reference clock signal. Alternatively, the intermediate clock generator includes: a counter for performing a counting operation in synchronization with the reference clock signal; and a shift register for shifting an output of the frequency divider alternately in synchronization with the reference clock signal and a second reference clock signal, which is one of the multi-phase clock signals and different from the reference clock signal. The reference clock signal and the second reference clock signal are 180° out of phase with each other.

DETAILED DESCRIPTION OF THE INVENTION

Hereinafter, the preferred embodiments of the present invention will be described with reference to the accompanying drawings.

First Embodiment

Figure 1:
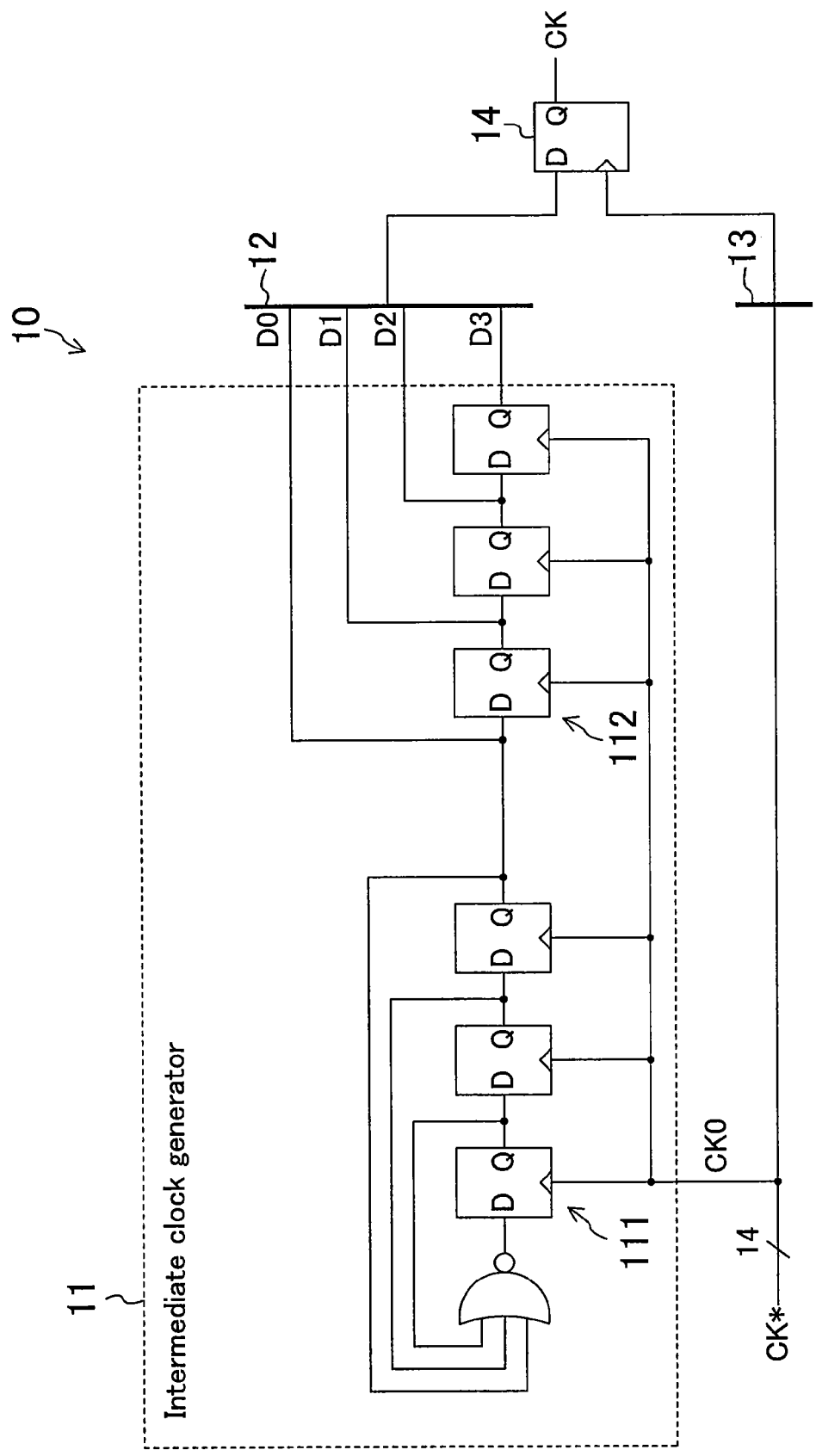
FIG. 1 illustrates the configuration of a clock signal generation device according to a first embodiment of the invention.

FIG. 1 illustrates the configuration of a clock signal generation device (which may be hereinafter referred to simply as a "device") according to a first embodiment. In the device 10 of this embodiment, an intermediate clock generator 11 generates multi-phase (four-phase in this embodiment) intermediate clock signals D* (D0 to D3). One cycle of the multi-phase intermediate clock signals D* is equal to four cycles of a clock signal CK0, which is one of the multi-phase (14-phase in this embodiment) clock signals CK* input to the device 10, and a minimum phase difference among the multi-phase intermediate clock signals D* is greater than a minimum phase difference among the multi-phase clock signals CK*. To be specific, in the intermediate clock generator 11, a counter 111 performs a counting operation in synchronization with the clock signal CK0. The counter 111 can be composed of a quaternary counter. A shift register 112 shifts the output of the counter 111 in synchronization with the clock signal CK0. The intermediate clock signal D0 is the output of the counter 111, and the intermediate clock signals D1 to D3 are the respective outputs of registers included in the shift register 112. That is, the intermediate clock generator 11 generates the multi-phase intermediate clock signals D* whose H logic level periods do not overlap each other.

Figure 2:
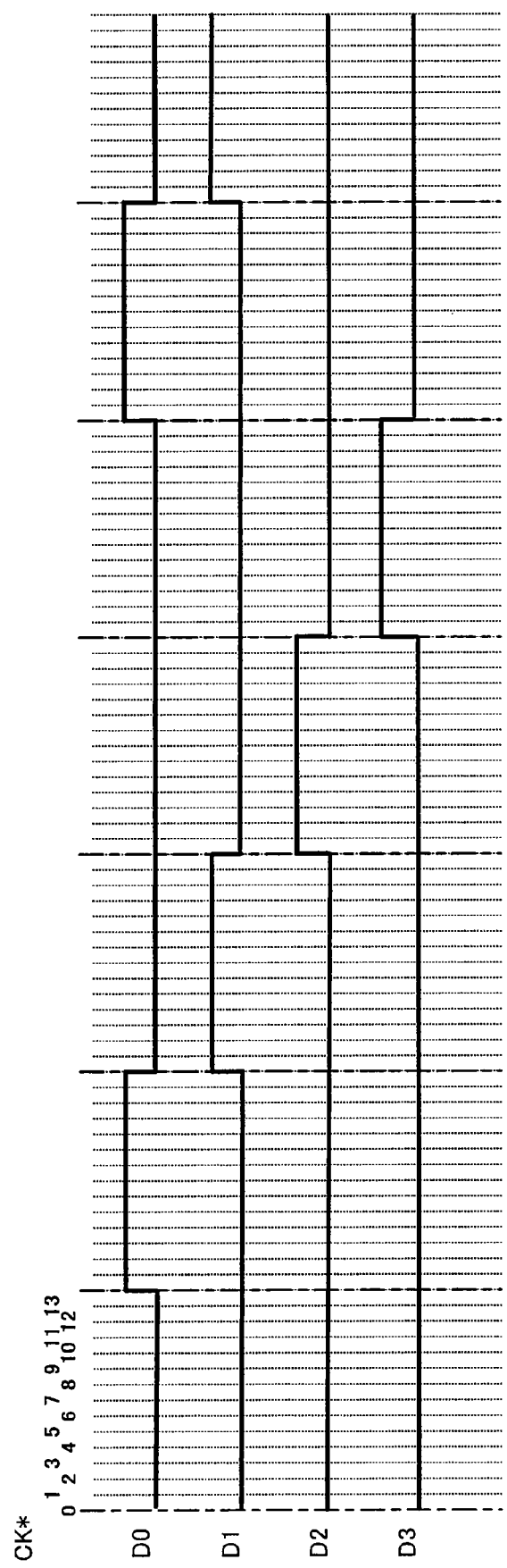
FIG. 2 is a timing diagram showing the relation between multi-phase clock signals and multi-phase intermediate clock signals according to the first embodiment.

FIG. 2 shows the relation between the multi-phase clock signals CK* and the multi-phase intermediate clock signals D*. In FIG. 2, the timings of rising edges of clock signals CK0 to CK13, which are the respective phases of the multi-phase clock signals CK*, are indicated by numerals and dashed lines.

Referring back to FIG. 1, a phase selector 12 selects one of the multi-phase intermediate clock signals D*. A phase selector 13 selects one of the multi-phase clock signals CK*. A latch circuit 14 latches the intermediate clock signal selected by the phase selector 12 with the clock signal selected by the phase selector 13. A clock signal CK output from the latch circuit 14 is the output of the device 10. That is, the frequency of the clock signal CK generated by the device 10 is one quarter of the original frequency (i.e., the frequency of the multi-phase clock signals CK*), but the number of selectable phases is increased by four times. For example, if it is assumed that the frequency of the multi-phase clock signals CK* is 160 MHz, the device 10 generates the clock signal CK of 40 MHz having a phase resolution of 56.

As described above, in this embodiment, generation of the intermediate clock signals having just four phases, and the two phase selectors, i.e., the four-input phase selector and the 14-input phase selector, are all that is required to achieve the output having a phase resolution of 56. That is, it is possible to generate the high resolutional phase information using the circuit of relatively small size.

Second Embodiment

Figure 3:
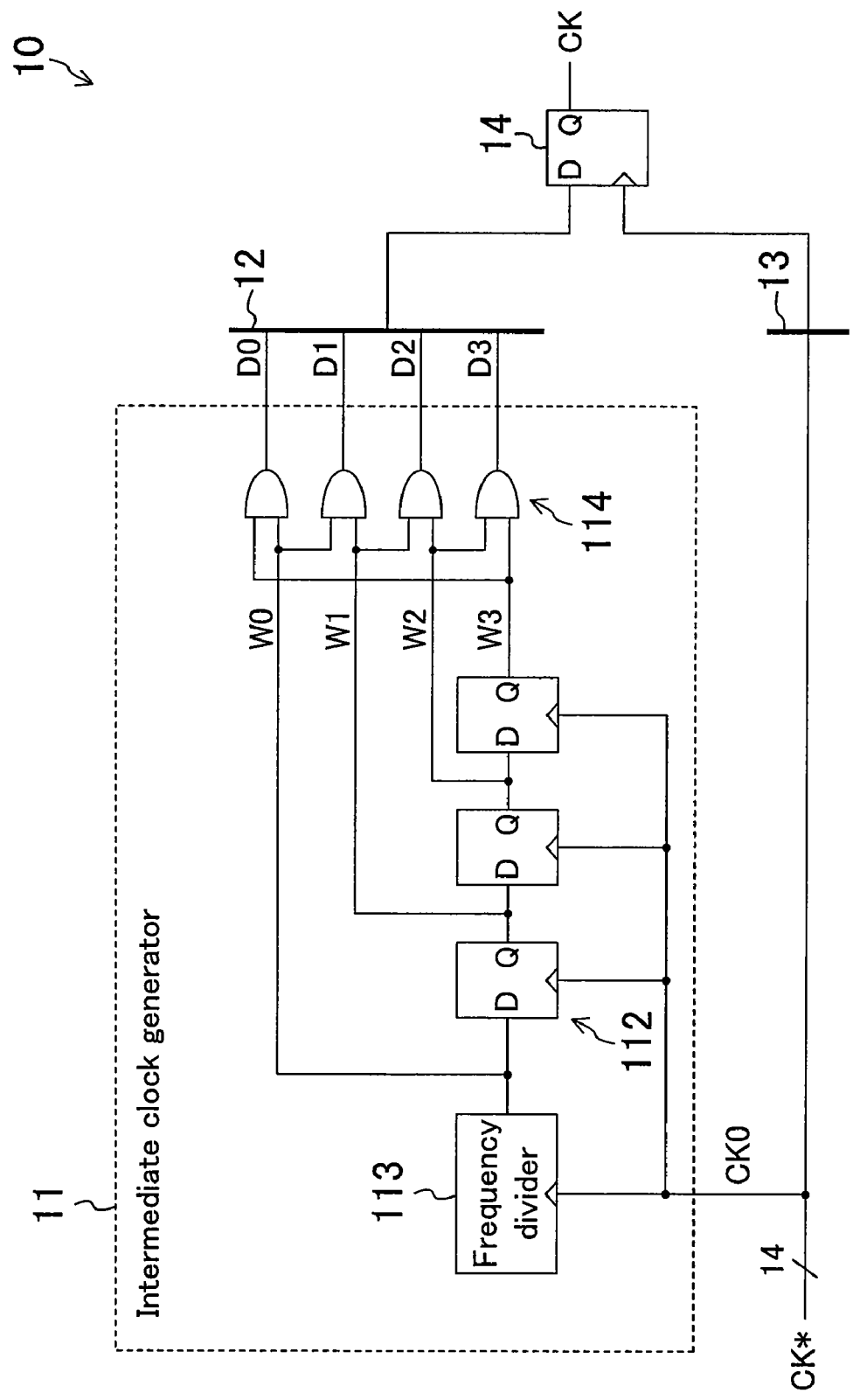
FIG. 3 illustrates the configuration of a clock signal generation device according to a second embodiment of the invention.

FIG. 3 illustrates the configuration of a clock signal generation device according to a second embodiment. The device 10 of this embodiment includes an intermediate clock generator 11 whose configuration is different from that of the first embodiment. This embodiment will be described only in terms of its differences from the first embodiment.

In the intermediate clock generator 11, a frequency divider 113 divides the frequency of a clock signal CK0. The frequency divider 113 can be composed of a ¼ frequency divider. A shift register 112 shifts the output of the frequency divider 113 in synchronization with the clock signal CK0. A logic operation section 114 performs an AND operation on each possible pair of signals which are adjacent in terms of phase relation among an output signal W0 of the frequency divider 113 and output signals W1 to W3 of registers included in the shift register 112. Intermediate clock signals D0 to D3 are the respective outputs of AND gates included in the logic operation section 114. That is, the intermediate clock generator 11 generates the multi-phase intermediate clock signals D* whose H logic level periods overlap each other.

Figure 4:
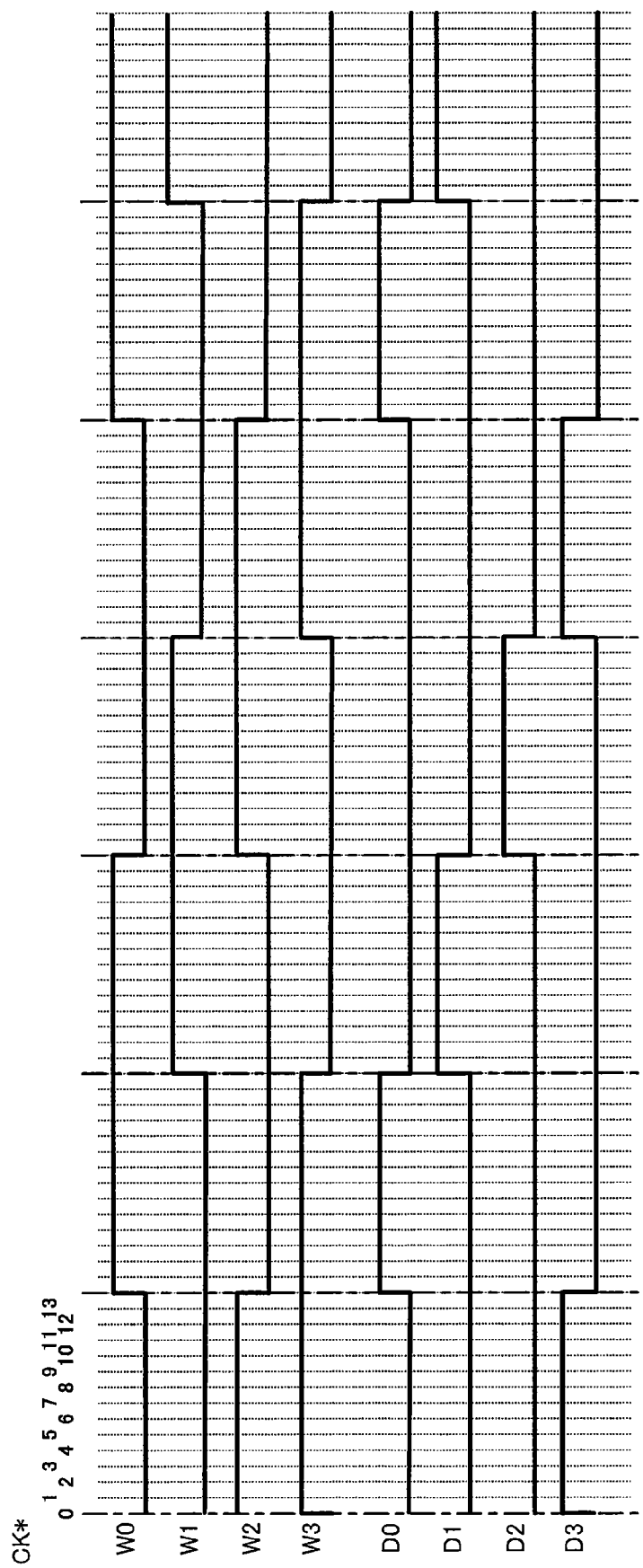
FIG. 4 is a timing diagram showing the relation between multi-phase clock signals and multi-phase intermediate clock signals according to the second embodiment.

FIG. 4 shows the relation between multi-phase clock signals CK* and the multi-phase intermediate clock signals D*. In FIG. 4, the timings of rising edges of clock signals CK0 to CK13, which are the respective phases of the multi-phase clock signals CK*, are indicated by numerals and dashed lines.

As described above, in this embodiment, since all pieces of candidate phase information are not generated, neither a circuit for generating all pieces of phase information nor a phase selector for selecting one piece from all of the generated phase information pieces are necessary. Accordingly, it is possible to generate high resolutional phase information using the circuit of relatively small size.

Third Embodiment

Figure 5:
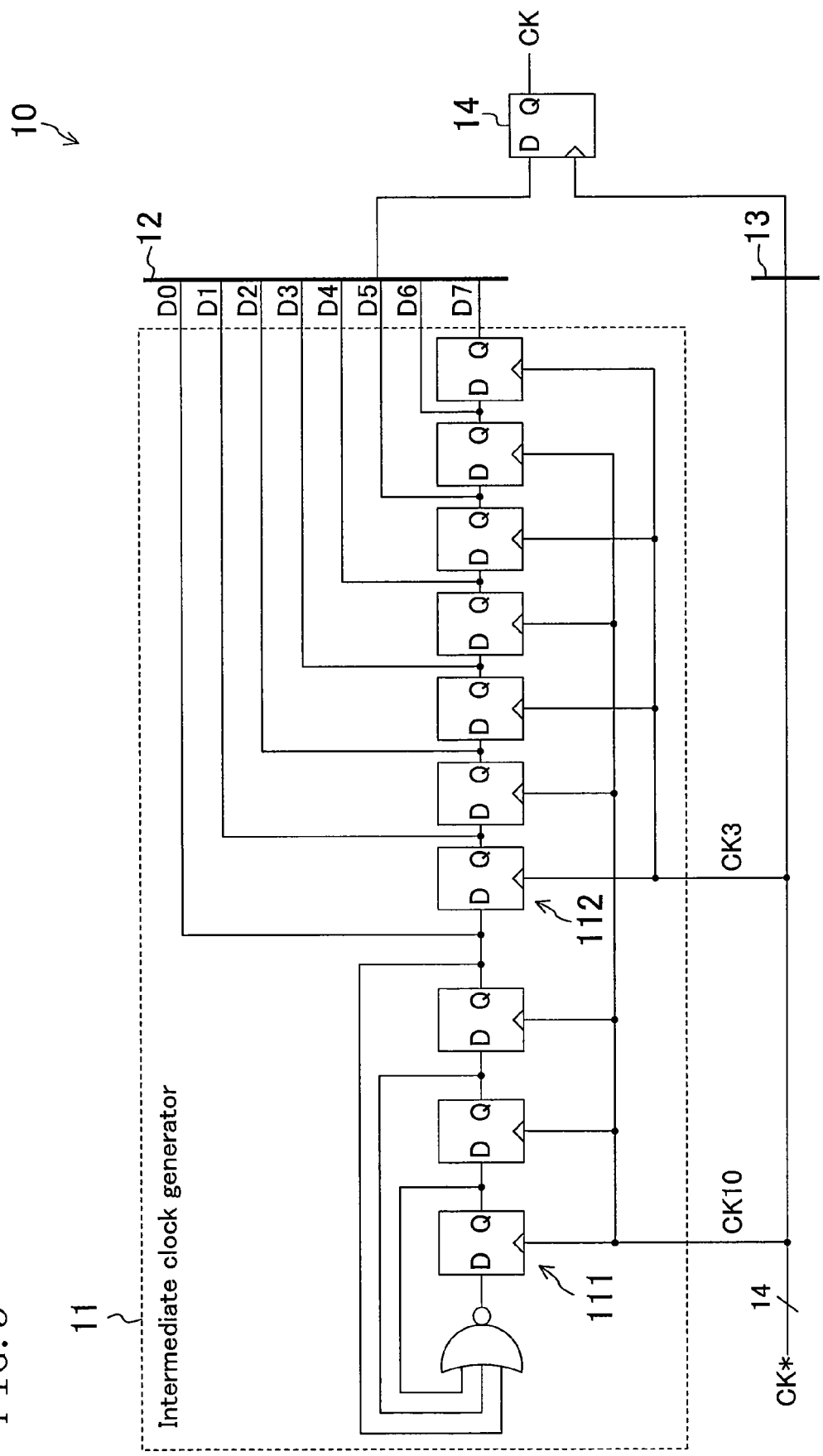
FIG. 5 illustrates the configuration of a clock signal generation device according to a third embodiment of the invention.

In the clock signal generation devices 10 according to the first and second embodiments, the timings of logic level changes in the intermediate clock signals D* coincide with the timings of rising edges of the clock signal CK0. Therefore, if the multi-phase intermediate clock signals D* do not reach the phase selector 12 before the multi-phase clock signals CK* reach the phase selector 13, a time series incompatibility will arise. Furthermore, a phase difference between the multi-phase intermediate clock signals D* and the multi-phase clock signals CK* is very small, that is, the setup margin of the intermediate clock signal selected by the phase selector 12 is slight. In light of this, consideration will be given to how to ensure the setup margin of the intermediate clock signal. FIG. 5 illustrates the configuration of a clock signal generation device according to a third embodiment. The device 10 of this embodiment includes an intermediate clock generator 11 whose configuration is different from those of the first and second embodiments. This embodiment will be described only in terms of its differences from the first and second embodiments.

The intermediate clock generator 11 generates multi-phase (eight-phase in this embodiment) intermediate clock signals D* (D0 to D7) each of whose one cycle is equal to four cycles of a clock signal CK10, which is one of the multi-phase clock signals CK* input to the device 10. To be specific, in the intermediate clock generator 11, a counter 111 performs a counting operation in synchronization with the clock signal CK10. A shift register 112 shifts the output of the counter 111 alternately in synchronization with the clock signal CK10 and a clock signal CK3, which 180° out of phase with the clock signal CK10. The intermediate clock signal D0 is the output of the counter 111, and the intermediate clock signals D1 to D7 are the respective outputs of registers included in the shift register 112. That is, the intermediate clock generator 11 generates the multi-phase intermediate clock signals D* whose H logic level periods overlap each other.

Figure 6:
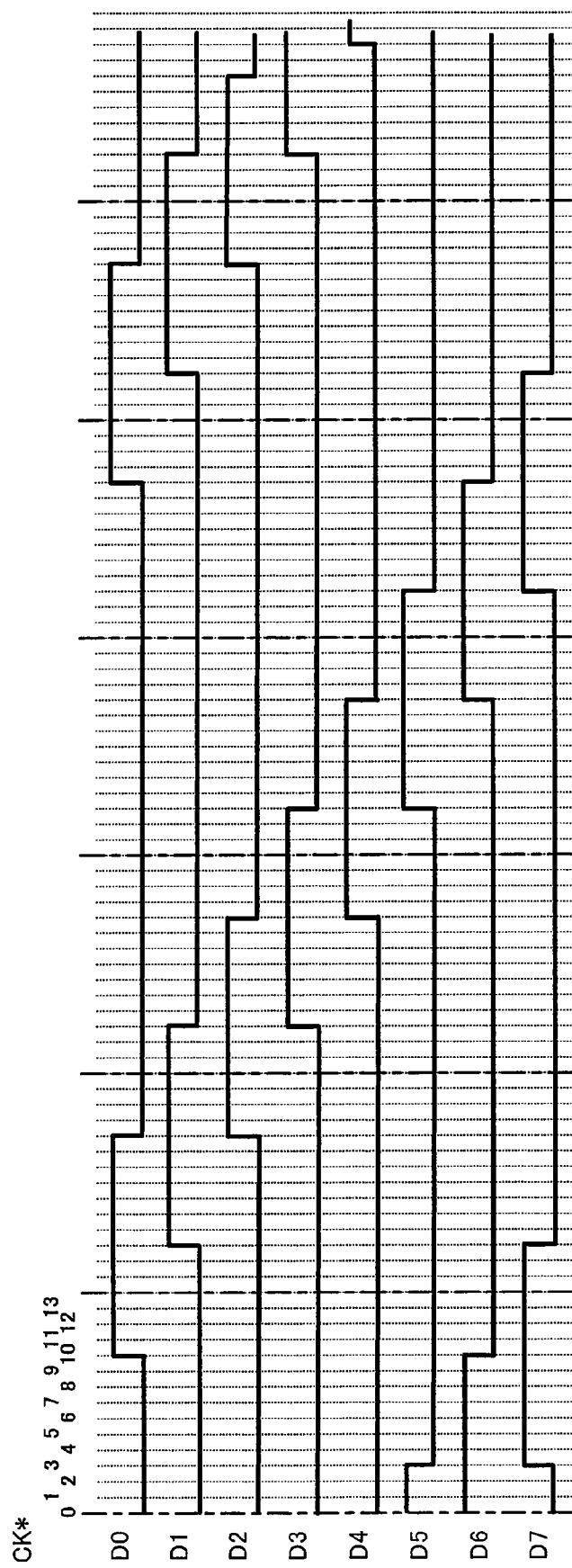
FIG. 6 is a timing diagram showing the relation between multi-phase clock signals and multi-phase intermediate clock signals according to the third embodiment.

FIG. 6 shows the relation between the multi-phase clock signals CK* and the multi-phase intermediate clock signals D*. In FIG. 6, the timings of rising edges of clock signals CK0 to CK13, which are the respective phases of the multi-phase clock signals CK*, are indicated by numerals and dashed lines.

Referring back to FIG. 5, a phase selector 13 selects a clock signal so that an intermediate clock signal selected by a phase selector 12 is latched by a latch circuit 14 while being stable at the H logic level. Specifically, in cases in which the phase selector 12 selects one of the intermediate clock signals D0, D2, D4, and D6, the phase selector 13 selects one of the clock signals CK0 to CK6, and in cases in which the phase selector 12 selects one of the intermediate clock signals D1, D3, D5, and D7, the phase selector 13 selects one of the clock signals CK7 to CK13.

As described above, in this embodiment, the setup margin of the intermediate clock signal is ensured, thereby enabling the intermediate clock signal to be latched accurately.

Fourth Embodiment

Figure 7:
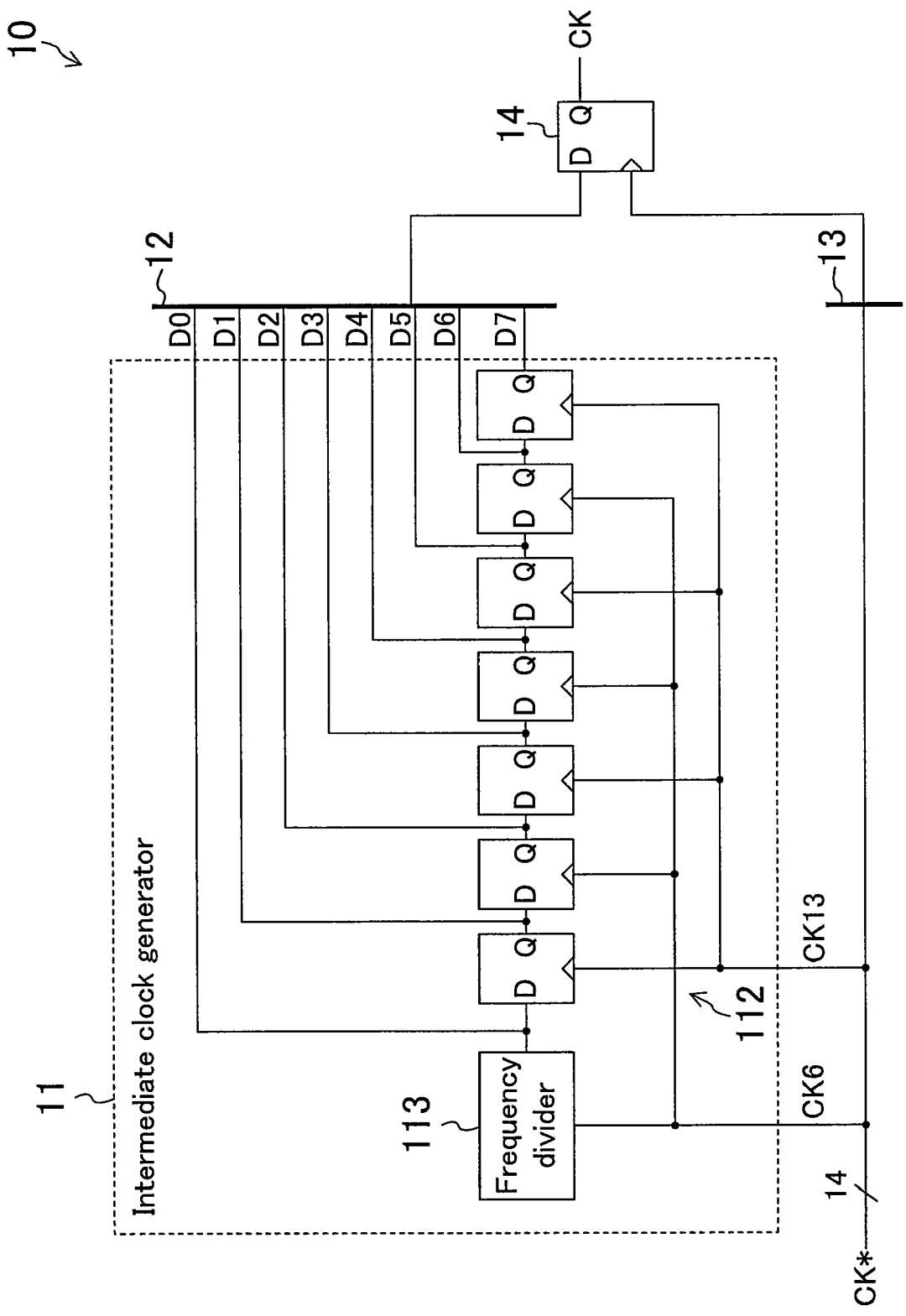
FIG. 7 illustrates the configuration of a clock signal generation device according to a fourth embodiment of the invention.

Some applications need a clock signal having a duty ratio of 50%. However, the clock signal CK generated by the clock signal generation devices 10 according to the first to third embodiments does not have a duty ratio of 50%. Therefore, consideration will be given to how to generate a clock signal having a duty ratio of 50%. FIG. 7 illustrates the configuration of a clock signal generation device according to a fourth embodiment. The device 10 of this embodiment includes an intermediate clock generator 11 whose configuration is different from those of the first to third embodiments. This embodiment will be described only in terms of its differences from the first to third embodiments.

In the intermediate clock generator 11, a frequency divider 113 divides the frequency of a clock signal CK6. A shift register 112 shifts the output of the frequency divider 113 alternately in synchronization with the clock signal CK6 and a clock signal CK13, which is 180° out of phase with the clock signal CK6. An intermediate clock signal D0 is the output of the frequency divider 113, and intermediate clock signals D1 to D7 are the respective outputs of registers included in the shift register 112. That is, the intermediate clock generator 11 generates the multi-phase intermediate clock signals D* whose H logic level periods overlap each other.

Figure 8:
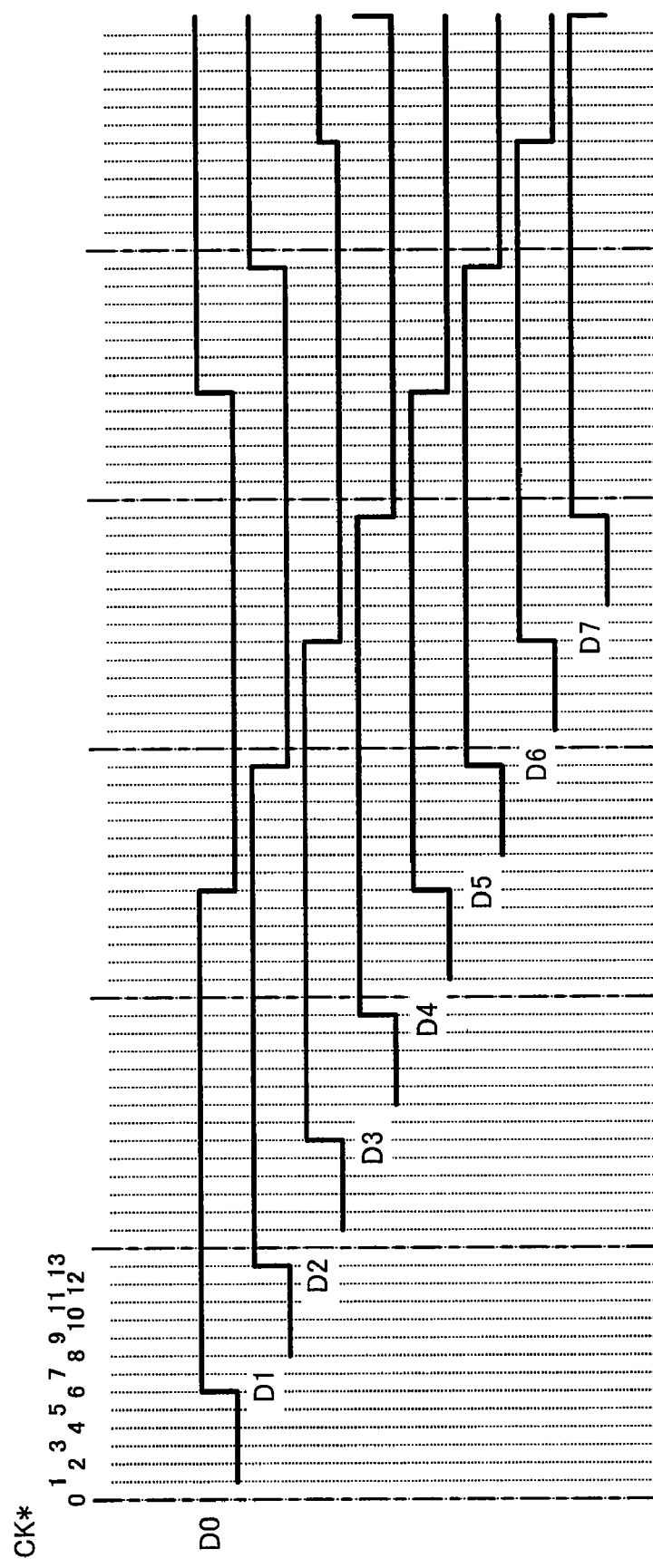
FIG. 8 is a timing diagram showing the relation between multi-phase clock signals and multi-phase intermediate clock signals according to the fourth embodiment.

FIG. 8 shows the relation between multi-phase clock signals CK* and the multi-phase intermediate clock signals D*. In FIG. 8, the timings of rising edges of clock signals CK0 to CK13, which are the respective phases of the multi-phase clock signals CK*, are indicated by numerals and dashed lines.

Referring back to FIG. 7, in cases in which a phase selector 12 selects one of the intermediate clock signals D0, D2, D4, and D6, a phase selector 13 selects one of the clock signals CK0 to CK6, and in cases in which the phase selector 12 selects one of the intermediate clock signals D1, D3, D5, and D7, the phase selector 13 selects one of the clock signals CK7 to CK13. In this manner, when the signals obtained by dividing the frequency of the multi-phase clock signals CK* are used as the multi-phase intermediate clock signals D*, two rising edges of the clock signal selected by the phase selector 13 occur during each of the time period in which the intermediate clock signal selected by the phase selector 12 is at the H logic level and the time period in which the intermediate clock signal selected by the phase selector 12 is at the L logic level. Hence, it is possible to make a clock signal CK output from a latch circuit 14 have a duty ratio of 50%, while ensuring the setup margin of the intermediate clock signal.

In this embodiment, special attention should be paid to the timing of the second rising edge of the clock signal that occurs during the time period in which the intermediate clock signal is at the H logic level. For example, in the timing diagram shown in FIG. 8, the timing of a falling edge of the intermediate clock signal D0 coincides with the timing of a rising edge of the clock signal CK6. If the falling edge of the intermediate clock signal D0 occurs earlier than the rising edge of the clock signal CK6, the L logic level will be latched improperly. This is a typical problem occurring due to a small hold margin.

Therefore, in order to ensure a hold margin, the idea of "zero hold margin" is adopted. To be specific, first, the circuit configuration of signal transmission lines is designed so that the delay of the multi-phase clock signals CK* in reaching the phase selector 13 is less than the delay of the multi-phase intermediate clock signals D* output from the intermediate clock generator 11 in reaching the phase selector 12. And then, in cases in which the phase selector 12 selects one of the intermediate clock signals D0, D2, D4, and D6 whose logic level changes on the rising edges of the clock signal CK6, the phase selector 13 is made to select one of the clock signals CK0 to CK6. Also, specifically, in cases in which the phase selector 12 selects one of the intermediate clock signals D1, D3, D5, and D7 whose logic level changes on the rising edges of the clock signal CK13, the phase selector 13 is made to select one of the clock signals CK7 to CK13.

As described above, in this embodiment, it is possible to generate a clock signal having a duty ratio of 50%. Moreover, the setup margin and hold margin of the intermediate clock signal are ensured, thereby allowing the intermediate clock signal to be latched more accurately. It should be noted that this embodiment dose not have to be based on the idea of "zero hold margin", and instead a circuit configuration may be adopted in which the phase relation between the multi-phase clock signals CK* and the intermediate clock signals D* is adjusted as appropriate so as to ensure a hold margin equal to or larger than one phase of the multi-phase clock signals CK*.

In cases in which the multi-phase intermediate clock signals D* whose H logic level periods overlap each other are generated as in the third and fourth embodiments, phase differences in the intermediate clock signals do not necessarily have to be 180°. To be specific, the multi-phase clock signals CK* are divided into two or more groups, and a window (an intermediate clock signal) having a length equal to 14 phases is provided to the clock signals belonging to each group, and it will be sufficient if the intermediate clock signal can be latched in the vicinity of the center of that window.

The number of phases of the multi-phase clock signals CK* input to the clock signal generation devices according to the present invention is not limited to 14. Furthermore, the number of phases of the intermediate multi-phase clock signals D* is not limited to four or eight.

Moreover, the clock signal generation devices 10 according to the first to fourth embodiments may be configured as a semiconductor integrated circuit by integrating the intermediate clock generator 11, the phase selectors 12 and 13, and the latch circuit 14 on a single chip. Alternatively, the clock signal generation devices 10 may be executed by an FPGA (Field Programmable Gate Array) or the like by writing logic description in Verilog® HDL, etc.

Embodiment of Electronic Equipment

Figure 9:
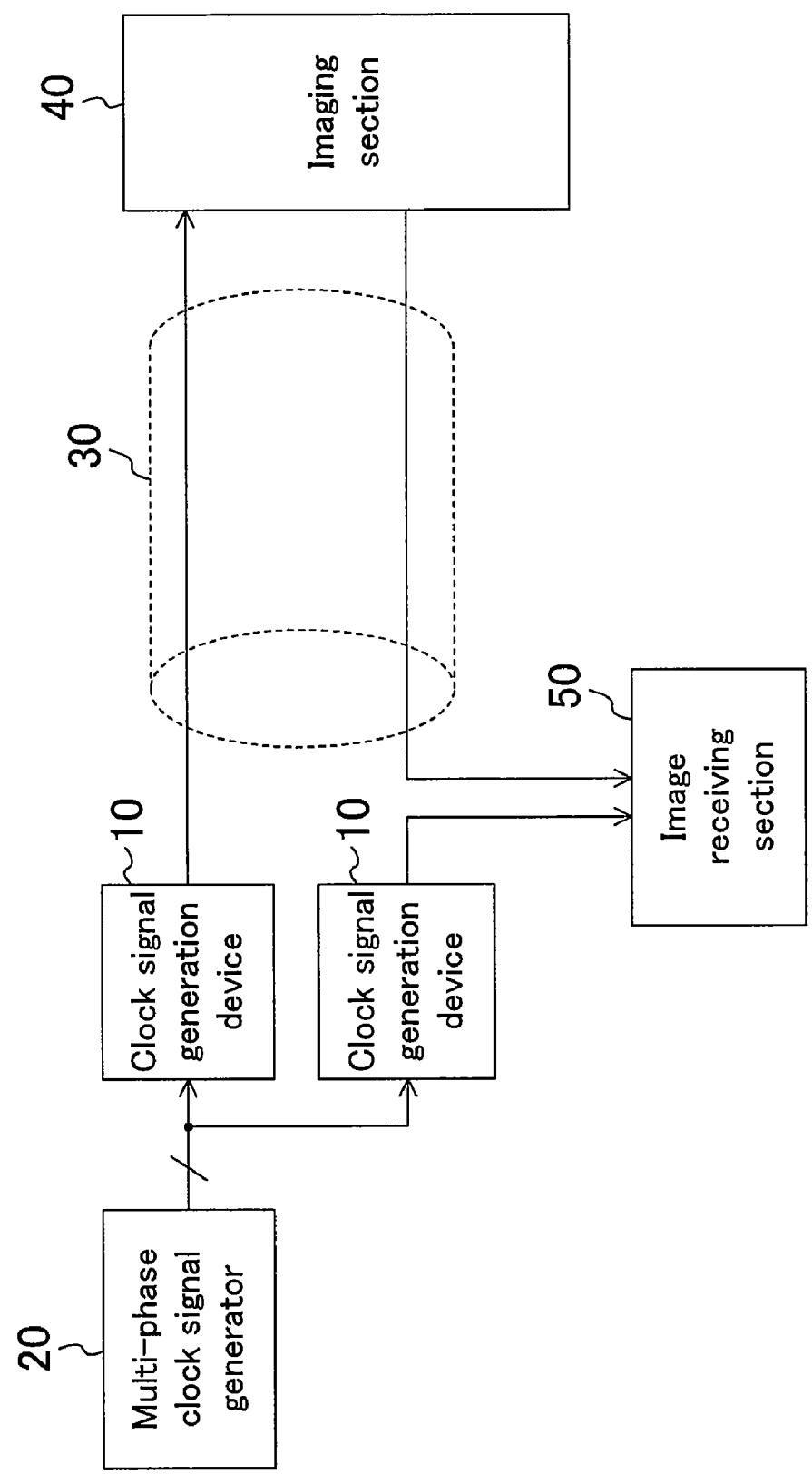
FIG. 9 illustrates the configuration of an embodiment of electronic equipment according to the invention.

FIG. 9 illustrates the configuration of a CCD imaging system for a gastroscope as an embodiment of electronic equipment according to the present invention. In this system, each of two clock signal generation devices 10 receives multi-phase clock signals generated by a multi-phase clock signal generator 20 and outputs a clock signal having a desired phase. These clock signal generation devices 10 are both configured according to the present invention, specifically, as described in the first to fourth embodiments. The clock signal output from one of the clock signal generation devices 10 is supplied to an imaging section 40 through a transmission path 30 (i.e., a cable orally inserted into an examinee). And a video signal taken by the imaging section 40 is supplied to an image receiving section 50 through the transmission path 30. The image receiving section 50 is provided with the clock signal output from the other clock signal generation device 10.

Typically, in CCD imaging systems for a gastroscope, the length of the transmission path 30 varies from one system to another. It is therefore difficult to estimate an optimum synchronization phase for a clock signal to be supplied to the image receiving section 50. Thus, the optimum synchronization phase is adjusted by calibration of the phase of the clock signal output from the clock signal generation device 10.

In the filed of application specific LSIs such as described above as well as in other fields, the degree of integration has been increasing for higher performance and greater functionality, and a reduction in circuit size is an essential issue. In this respect, the clock signal generation devices according to the present invention, which are able to be configured in smaller circuit size than the conventional devices, are advantageous.

The clock signal generation devices according to the present invention generate a clock signal having a desired phase from input multi-phase clock signals, while having a relatively small circuit size, and are thus are applicable to CCD imaging systems for a gastroscope, large-scale SoCs which include a large number of function blocks, and the like.

What is claimed is:

1. A clock signal generation device, comprising:
   an intermediate clock generator for generating, by using one of input multi-phase clock signals as a reference clock signal, multi-phase intermediate clock signals each of whose one cycle is equal to a plurality of cycles of the reference clock signal and among which a minimum phase difference is greater than a minimum phase difference among the multi-phase clock signals;
   a first phase selector for selecting one of the multi-phase intermediate clock signals;
   a second phase selector for selecting one of the multi-phase clock signals; and
   a latch circuit for latching the intermediate clock signal selected by the first phase selector with the clock signal selected by the second phase selector.

2. The clock signal generation device of claim 1, wherein the intermediate clock generator generates, as the multi-phase intermediate clock signals, multi-phase clock signals whose specific logic level periods do not overlap each other.

3. The clock signal generation device of claim 2, wherein the intermediate clock generator includes:
   a counter for performing a counting operation in synchronization with the reference clock signal; and
   a shift register for shifting an output of the counter in synchronization with the reference clock signal.

4. The clock signal generation device of claim 2, wherein the intermediate clock generator includes:
   a frequency divider for dividing a frequency of the reference clock signal;
   a shift register for shifting an output of the frequency divider in synchronization with the reference clock signal; and
   a logic operation section for performing an AND operation on each possible pair of signals which are adjacent in terms of phase relation each other among an output of the frequency divider and outputs of registers included in the shift register.

5. The clock signal generation device of claim 1, wherein the intermediate clock generator generates, as the multi-phase intermediate clock signals, multi-phase clock signals whose specific logic level periods overlap each other; and
   the second phase selector selects the clock signal so that the intermediate clock signal selected by the first phase selector is latched by the latch circuit while being stable at the specific logic level.

6. The clock signal generation device of claim 5, wherein the intermediate clock generator includes:
   a counter for performing a counting operation in synchronization with the reference clock signal; and
   a shift register for shifting an output of the counter alternately in synchronization with the reference clock signal and a second reference clock signal, which is one of the multi-phase clock signals and different from the reference clock signal.

7. The clock signal generation device of claim 6, wherein the reference clock signal and the second reference clock signal are 180° out of phase with each other.

8. The clock signal generation device of claim 5, wherein the intermediate clock generator includes:
   a counter for performing a counting operation in synchronization with the reference clock signal; and
   a shift register for shifting an output of a frequency divider alternately in synchronization with the reference clock signal and a second reference clock signal, which is one of the multi-phase clock signals and different from the reference clock signal.

9. The clock signal generation device of claim 8, wherein the reference clock signal and the second reference clock signal are 180° out of phase with each other.

10. A semiconductor integrated circuit comprising the clock signal generation device of claim 1.

11. Electronic equipment comprising the semiconductor integrated circuit of claim 10.

12. A method for generating a clock signal, comprising:

a first step of generating, by using one of input multi-phase clock signals as a reference clock signal, multi-phase intermediate clock signals each of whose one cycle is equal to a plurality of cycles of the reference clock signal and among which a minimum phase difference is greater than a minimum phase difference among the multi-phase clock signals;

a second step of selecting one of the multi-phase intermediate clock signals;

a third step of selecting one of the multi-phase clock signals; and a fourth step of latching the intermediate clock signal selected in the second step with the clock signal selected in the third step.

* * * * *